United States Patent [19]

Shreve

[11] 4,081,769
[45] Mar. 28, 1978

[54] ACOUSTIC SURFACE WAVE RESONATOR WITH SUPPRESSED DIRECT COUPLED RESPONSE

[75] Inventor: William Robert Shreve, Dallas, Tex.
[73] Assignee: Texas Instruments Incorporated, Dallas, Tex.
[21] Appl. No.: 723,008
[22] Filed: Sep. 13, 1976
[51] Int. Cl.² ............... H03H 9/04; H03H 9/26; H03H 9/32; H01L 41/10
[52] U.S. Cl. .................. 333/72; 310/313; 333/30 R
[58] Field of Search ........... 333/30 R, 72; 310/9.8, 310/313; 235/181; 331/107 A; 330/5.5

[56] References Cited

U.S. PATENT DOCUMENTS

| | | | |
|---|---|---|---|
| 3,886,504 | 5/1974 | Hartmann et al. | 333/72 |
| 3,931,597 | 1/1976 | Cho et al. | 333/72 X |
| 3,955,159 | 5/1976 | Mitchell et al. | 333/72 X |
| 3,961,293 | 6/1976 | Hartmann et al. | 333/72 |

Primary Examiner—Alfred E. Smith
Assistant Examiner—Marvin Nussbaum
Attorney, Agent, or Firm—James T. Comfort; Rene E. Grossman; James J. Elacqua

[57] ABSTRACT

Acoustic surface wave resonator device having two sets of reflector arrays on a piezoelectric substrate with structurally modified coupling transducers interposed therebetween, wherein the transducers are coupled to the standing wave resonance in the resonance cavity but are respectively decoupled from the surface wave launched by the other transducer, thereby suppressing direct coupled response without materially affecting the resonance response. In a typical embodiment, a pair of interdigital transducers are disposed between two sets of reflector arrays on a piezoelectric substrate, with the fingers of the respective transducers including intermediate off-set portions thereof. Specifically, the intermediate off-set portion in each interdigital finger extends over a distance λ/4, with the space between successive fingers in a transducer being λ/2. The reflector arrays are spaced to set up a standing wave at resonance, and the transducers are so located to dispose the center line of each finger on the peak of the standing wave. The off-set portions in the fingers of the respective transducers extend in opposite directions so as to cause the wavefront of a wave launched by one transducer to have a 180° phase shift along the length of the finger of the other transducer. The net change in the finger due to this wave is zero such that no signal is generated, thus suppressing the transducer response.

14 Claims, 7 Drawing Figures

ACOUSTIC SURFACE WAVE RESONATOR WITH SUPPRESSED DIRECT COUPLED RESPONSE

BACKGROUND OF THE INVENTION

This invention relates to acoustic surface wave resonator devices and more particularly to resonator devices having interdigital transducers whose linear fingers have intermediate angular offsets one-quarter wavelength at resonant frequency.

There is frequently a requirement in communications and other electronic equipment for filters possessing a very narrow frequency response. High Q resonators have a long history of application in frequency management functions requiring stable and precise performance. These applications fall into one or two categories:

1. frequency control of stable oscillators requiring very high Q and low aging rate, and
2. multi-pole filters for channel control and frequency-multiplexed communication in radio systems.

For many years the quartz crystal resonator has been a key element in achieving narrow frequency response required because of its high Q, low aging, and easy fabrication. However, its fundamental resonant frequency is inversely proportional to the thickness of the crystal so that good performance above 30 MHz becomes increasingly difficult to obtain since construction of this type of quartz crystal resonator results in a thin and fragile disc.

DESCRIPTION OF THE PRIOR ART

It has been discovered recently that such desirable frequency responses can be realized conveniently with a surface wave device. A device having this type of frequency response is disclosed in U.S. Pat. No. 3,886,504 issued May 27, 1975. Briefly, surface acoustic wave resonator devices may be visualized as a crystal resonator in which the acoustic energy is confined entirely to one surface of the substrate. A surface wave device consists first of a substrate of piezoelectric material such as quartz, lithium niobate, zinc oxide or cadmium sulfide, or thin films of piezoelectric materials on nonpiezoelectric substrates such as zinc oxide on silicon. Formed thereon, is a first input transducer for the purpose of converting input electrical energy to acoustical energy within the substrate. The input transducer generates surface waves with a periodicity determined by the spacing of adjacent electrodes, generating surface waves with maximum efficiency at a frequency where the acoustic wave length equals the periodicity of the transducer. This acoustical energy propagates along the surface of the substrate to the area of a second output transducer which performs the function of converting the acoustical energy to an electric output signal. The output transducer senses the electric fields which accompany the wave due to the piezoelectric effect. The degree of match between the surface-wave wavelength and the transducer period determines the relative conversion efficiency. Filtering properties of these devices are completely determined by the process of conversion of the electrical signal to acoustic energy.

The input and output transducers typically comprise interdigital transducers, as used in delay line and bandpass filter surface wave devices. Interdigital transducers are formed by depositing a thin film of electrically conductive material such as aluminum or gold on the substrate and patterning the thin film into an appropriate transducer structure. Electrical potentials coupled through the input interdigital transducers induce mechanical stresses in the piezoelectric substrate. The resultant strains propagate along the surface of the substrate away from the input interdigital transducer in the form of surface waves, such as, the well known Rayleigh waves or Love waves. A frequency response characteristic is associated with either the conversion of electric-to-acoustic energy by the input interdigital transducer or with the conversion of acoustic-to-electric energy by the output interdigital transducer. The nature of these frequency response characteristics is determined by the specific configuration of the transducers themselves.

When two interdigital transducers are used to make a bandpass filter, to a first approximation, it may be said that the bandwidth of the resultant bandpass filter is inversely proportional to the length of one or both of the interdigital transducers. In theory, at least, it appears possible to make the bandpass as narrow as desired by appropriately increasing the length of the interdigital transducers. One of the advantages of surface wave delay line devices, however, stems from the fact that sophisticated frequency responses are achievable with structures that are very small in volume. It has been found that by operating the surface wave device as a high Q resonator it is possible to attain the desired frequency response while retaining its advantageous small structure size. A way to operate the surface wave device as high Q resonator is described in the aforementioned U.S. Pat. No. 3,886,504, where the desired reflections of the acoustic surface waves to achieve a resonance is accomplished through the use of reflective grating structures placed at appropriate locations on the surface of the substrate itself.

One resonator configuration discussed in U.S. Pat. No. 3,886,504 involves placing input and output interdigital transducers in a cavity defined by two reflective grating structures. The frequency response of this configuration consists of two parts, a resonance peak on top of a characteristic transducer response. The peak corresponds to the energy coupled out of the standing wave set up between the two reflective grating arrays. The characteristic transducer response is the direct acoustic transmission between the input and output transducers. It is this response that was described previously in the discussion of acoustic surface wave devices for conventional bandpass applications. This characteristic response limits the near-in rejection obtainable in attempting to achieve a close to ideal resonance response.

SUMMARY OF THE INVENTION

In accordance with the present invention, an improved surface wave resonator device is provided in which transducer response is substantially reduced or eliminated without seriously affecting the resonance response of the device. To this end, input and output interdigital transducers are placed in a cavity defined by the area between two reflective grating structures disposed on a substrate of piezoelectric material. Both the input and output transducers include sets of opposed conductive pads and a plurality of interdigitated electrode fingers alternately originating from one and the other of the set of conductive pads. The transducers are placed so that the center line of each electrode finger is on the peak of the standing wave, but each electrode finger includes an intermediate portion thereof located in offset relationship to the peak of the standing wave. This results in a reduction in the coupling to the standing wave by a factor of 2. The output interdigital transducer is similar to the input interdigital transducer but having an intermediate portion of each of its electrode fingers offset in an opposite direction. The effect of offset is to cause the wavefront of a wave launched by the input transducer to have a 180° phase shift along the length of the electrode finger of the output transducer. The net charge on the output electrode finger due to this wavefront is zero, therefore no signal is generated and the two transducers are effectively decoupled away from resonance. However, the two transducers are still coupled to the standing wave in the cavity.

In another embodiment of the invention, the electrodes of the input and output interdigital transducers are extended from the transducer pads corresponding thereto at a position centered upon the peak of the standing wave wherein each electrode finger is configured to comprise a series of declensional offsets of one-quarter wavelength separated by linear portions of the electrode finger. Additional embodiments of the surface wave resonator device involve interdigital transducers with alternative versions of the transducer electrode fingers which may be in the form of a split electrode configuration having an angular offset and in the form of a linearly sloped electrode configuration. The split electrode configuration version of the interdigital transducers as included in the present invention comprises finger pairs centered upon the peak of a standing wave, each of said finger pairs including one linear finger perpendicularly extended from the transducer pad corresponding thereto, and a finger having an intermediate angular offset portion laterally crossing over the linear finger. In the linear sloped electrode version of the interdigital transducers as included in the present invention, the electrode finger extends from the corresponding transducer pad at an incline represented by the slope $\lambda/2d$ where $\lambda$ is the wavelength at the resonant frequency and "$d$" is the electrode length. The above described electrode configurations are effective to suppress the direct transmission of the acoustic wave from the input interdigital transducer to the output interdigital transducer, thus enhancing the resonance response of the acoustic surface wave resonator device. Just as a surface wave device whose interdigital transducers include linear electrodes can be used to form a multi-cavity resonator device, in like manner, a surface wave device using interdigital transducers having electrode fingers configured in accordance with the present invention to suppress direct transmission between the input and output transducers can also set-up a multi-cavity resonator.

DETAILED DESCRIPTION

Figure 1:
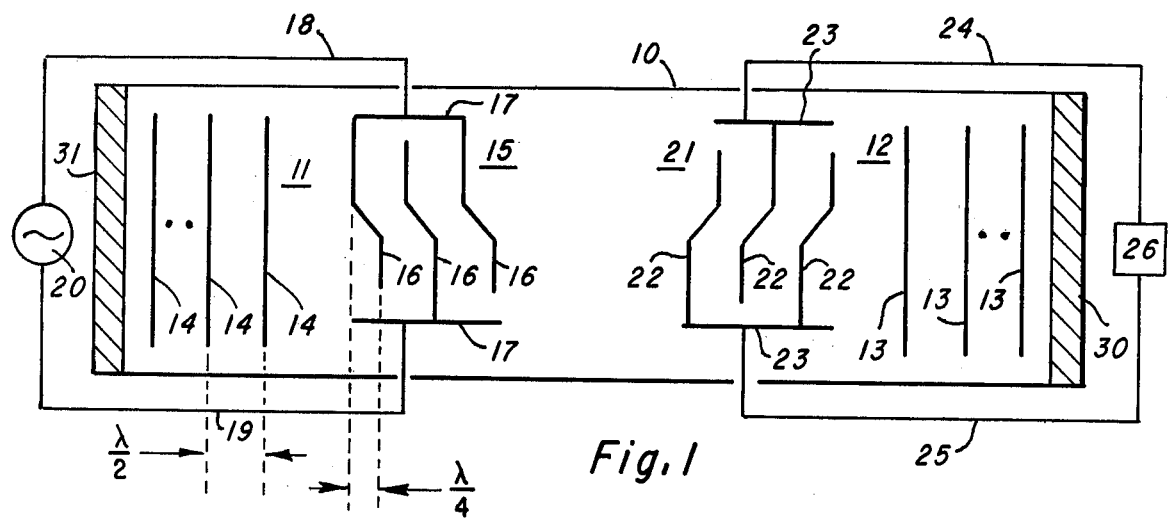
FIG. 1 is a plan view illustrating an acoustic surface wave resonator device constructed in accordance with the present invention.

Referring to FIG. 1, there is illustrated one embodiment of an acoustic surface wave resonator in accordance with the present invention. This surface wave device comprises a substrate 10 of piezoelectric material such as lithium niobate or quartz. First and second reflective grating structures 11, 12 are provided on the substrate 10, the reflective grating structures 11, 12 comprising respective pluralities of discontinuities 13, 14. The discontinuities 13, 14 are formed at the surface of substrate 10 so as to be capable of reflecting at least a portion of any surface waves incident thereon.

The discontinuities 13, 14 of the grating structures 11, 12 may be formed as a plurality of narrow thin film fingers or bars deposited on the surface of substrate 10. The bars may be formed of an electrically conductive material such as gold, copper or aluminum. Alternatively, they may be formed of a dielectric material such as silicon oxide, silicon nitride or zinc oxide. As another alternative, the reflecting discontinuities 13, 14 may be formed by selectively etching portions of the surface of substrate 10. In still another alternative the strips may be formed by any process which will vary the material properties of the surface. For example, the reflecting discontinuities 13, 14 may be formed as ion-implanted strips on the surface of substrate 10. While for purposes of illustration, each of grating structures 11, 12 is illustrated as having three discontinuity elements, it will be understood that many more such elements may be incorporated in the grating structures, 400 being a typical number, to enhance the total percentage of reflection of surface acoustic waves incident to the grating structures 11, 12.

Also formed on the surface of substrate 10 is an input interdigital transducer 15 and an output interdigital transducer 21 disposed in the cavity between reflective grating structures 11, 12. As shown in FIG. 1, the input and output transducers 15 and 21 comprise sets of opposed conductive transducer pads 17 and 23, and a plurality of electrode fingers 16 and 22 alternately originating from their respective transducer pads. The electrode fingers 16, 22 may be formed of a suitably patterned thin-film electrically conductive material such as gold, copper or aluminum. The electrode fingers 16, 22 are illustrated in FIG. 1 as having three fingers interleaved, with each finger having an intermediate offset portion between the linear portions of the finger. Although only three such fingers are shown, it will be understood that a larger or smaller number of electrode fingers may be provided for the respective transducers. The input interdigital transducer 15 is coupled by means of lines 18, 19 to an input electrical excitation source 20. The input and output interdigital transducers 15 and 21 are similar in all respects except for the direction of the intermediate offset portions of their electrode fingers. The output interdigital transducer 21 is coupled to an external load 26 by means of lines 24, 25. The extremities of substrate 10 may be suitably treated so as to affect the absorption of any surface waves incident thereon, thereby preventing the reflection of surface waves from the extremities of the substrate 10. Such treatment may comprise deposition of an absorbative material at the surface of the substrate 10 in areas at the opposite ends thereof. In this respect, the end portions 30, 31 of the substrate define respective surface wave absorption areas.

The term "offset intermediate portion" as used above and hereinafter in this application including the claims has reference to the intermediate portion of the electrode finger deviating from the linear portion of the finger in an angular manner. The intermediate portion slopes down toward the second linear portion a fixed distance $\lambda/4$ from the first linear portion of the finger, where $\lambda$ is the wavelength at the resonant frequency. The slope may be both positive and negative depending upon whether the electrode is used in the input or output interdigital transducer.

Figure 2:
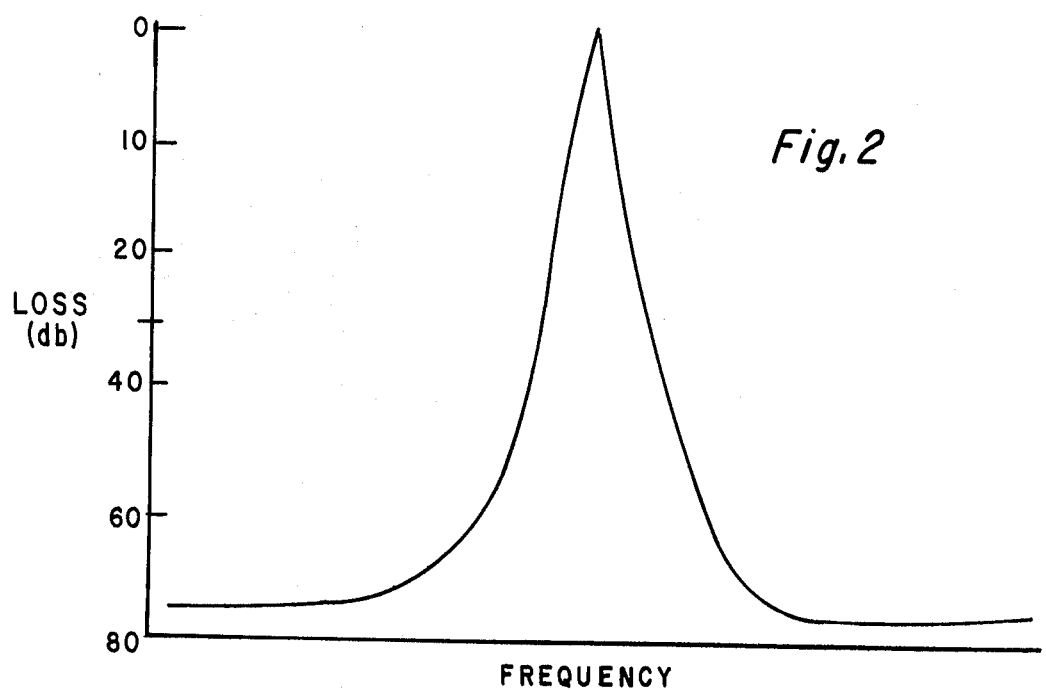
FIG. 2 is a graph showing an ideal resonance response curve of a two-port resonator device.
Figure 3:
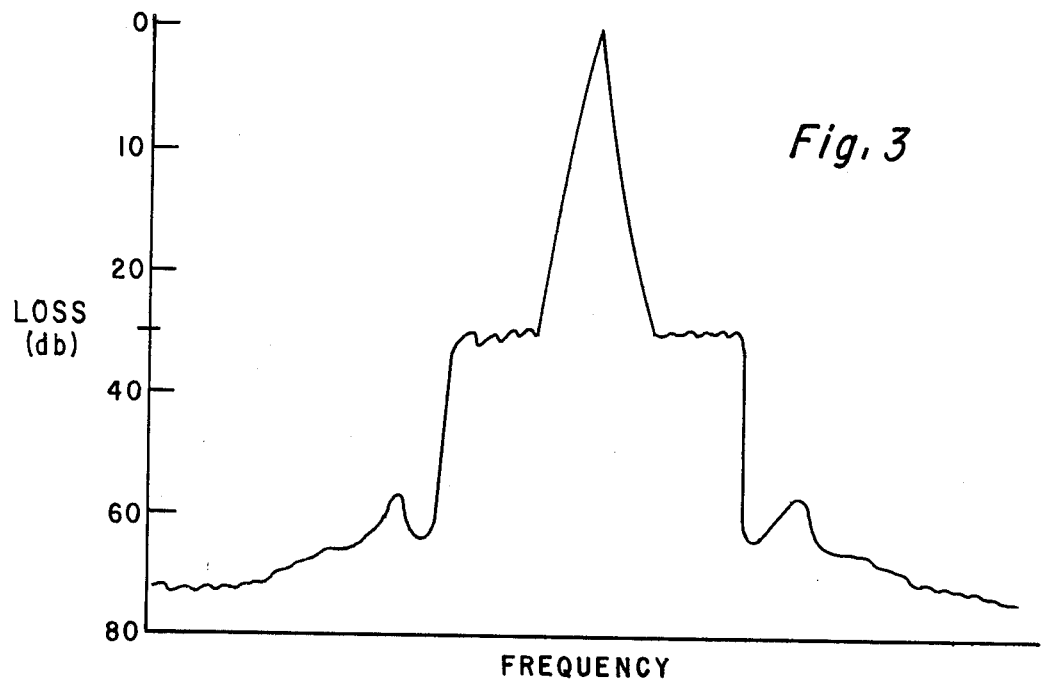
FIG. 3 is a graph showing a typical two-port resonator response demonstrating the transducer response and the resonance response.

Operationally, electrical energy provided by input source 20 is converted by the input interdigital transducer 15 to acoustic surface wave energy propagating along the surface of substrate 10. As these propagating surface waves reach the discontinuity elements 13, 14 of the grating structures 11, 12 they will be at least partially reflected by each of the discontinuity elements. The individual reflective discontinuities 13, 14 of each of the grating structures 11, 12 are equal-spaced with the distance between centers of adjacent discontinuities being equal to one-half wavelength at the resonant frequency of the resonator device. As a result, the waves reflected from the various discontinuity elements 13, 14 of the respective grating structues 11, 12 will reinforce in a coherent manner. If a suitable number of reflective discontinuities are provided, a total reflection of the incident acoustic waveform will occur. The presence of the two reflecting grating structures 11, 12 on the surface of substrate 10 results in a standing wave resonance being set-up between the two reflectors with a bandwidth which is controlled by the residual losses in the system. Proper realization of this standing wave resonance requires that the two reflecting grating structures 11, 12 be separated by approximately an integral number of half-wave lengths along the surface of substrate 10. The precise separation is dependent on the type of reflector used in the grating. The input interdigital transducer 15 is placed so that the center line of each finger 16 is placed on the peak of the standing wave, but since the intermediate portions of the fingers 16 are offset the individual segments sample the wave one-eighth wave length from the peak. In previous state-of-the-art resonator systems, direct transmission from input to output transducer results in a transducer frequency response as shown in FIG. 3. The purpose of this invention is to suppress this undesirable transducer response and approach the ideal resonance frequency response graphically shown in FIG. 2. The input transducer configuration reduces the coupling at resonance by $\sqrt{2}$. The output transducer 21 is set up in a similar manner but with its fingers 22 offset in the opposite direction to cause the wavefront of the wave launched by the input interdigital transducer 15 to have a 180° shift along the length of the respective fingers 22 of the output transducer 21. The net charge on the finger due to the wave directly transmitted is zero, thereby effectively decoupling the two transducers away from resonance, generating a zero signal at the output and retaining the transducer coupling to the standing wave. This condition can be expressed mathematically by representing the wave launched by two sine functions. The top segment of the respective electrode fingers of the input transducer 15 above the offset is represented by the function sin $2\pi$ ($ft-kx + \frac{1}{4}$), where $f$ is equal to the frequency of the desired standing wave resonance and the wave is a function of $t$ = time and $x$ = distance with $k$ = reciprocal wavelength of surface waves at the resonant frequency. The wave launched by the top segment and received by the output interdigital transducer 21 may be expressed as sin $2\pi$ ($ft + \theta + \frac{1}{4}$), where $\theta$ is the difference in phase of the wave as received at the output transducer. To determine the amount of direct transmission, the waves must be summed on the fingers of the output transducer. Thus, the output signal generated is equal to sin $2\pi$ ($ft + \theta$) + sin 2 $\pi$ ($ft + \theta \frac{1}{2}$). Changing sin $2\pi$ ($ft + \theta \frac{1}{2}$) to its equivalent sin [$2\pi$ ($ft + \theta$) + $\pi$] and using a basic trigonometric identity, for sin ($x + y$) = sin $x$ cos $y$ + cos $x$ sin $y$ where $x$ = $2\pi$ ($ft + \theta$) and $y = \pi$ the answer reduces to $-$ sin $2\pi(ft + \theta)$. Summing the wave along the output fingers results in a signal generation, sin $2\pi(ft + \theta) -$ sin $2\pi(ft + \theta) = 0$ thus allowing the wave to reflect off the reflected grating structures behind the output transducer thus reducing the transducer response and enhancing the usefulness of the acoustic surface wave resonator.

Figure 4:
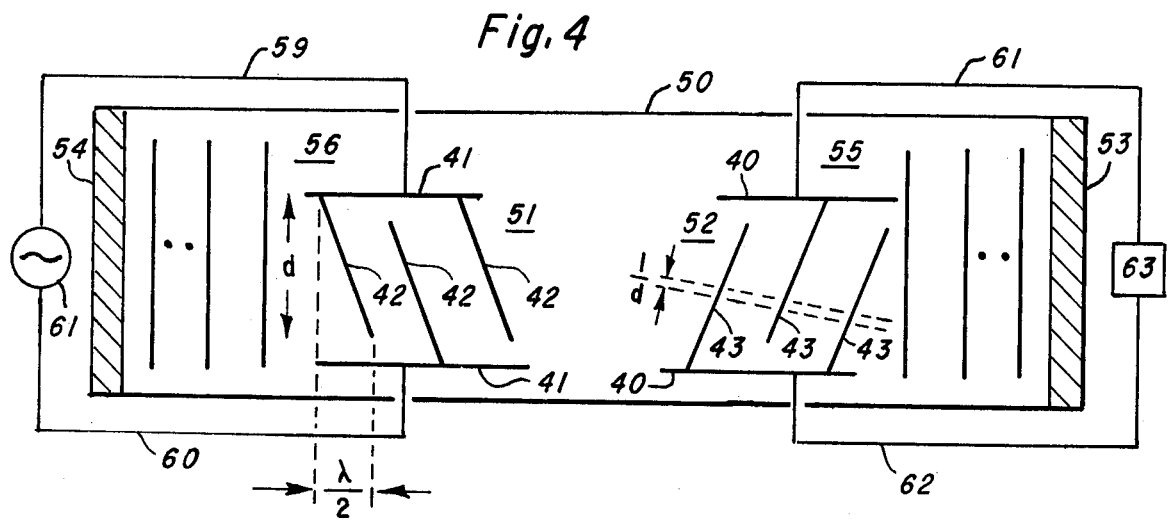
FIG. 4 is a plan view similar to FIG. 1, but another embodiment of an acoustic surface wave resonator device constructed in accordance with the present invention.

Another embodiment of an acoustic surface wave resonator device in accordance with the present invention is shown in FIG. 4 which diagrammatically illustrates the use of interdigital transducers having angular electrode fingers in spaced parallel relation. This embodiment is structurally similar in many respects to the embodiment of FIG. 1. It comprises first a substrate 50, preferably of piezoelectric material, the extremities of which may optionally be treated for surface wave absorption as at 53, 54. Reflective grating structures 55, 56 are arranged on the surface of the substrate 50 so as to provide a cavity therebetween for acoustic surface wave resonance. Input transducer 51 and output transducer 52 of the interdigital type, are located on the surface of substrate 50 between the two reflective grating structures 55, 56. The input and output transducers 51, 52 are comprised of angular electrode fingers 42, 43 in spaced parallel relation alternately originating from the conductive transducer pads 40, 41 at a slope equal to $\lambda/2$, where $\lambda$ is equal to the wavelength at the resonant frequency and $d$ is equal to the length of the electrode finger. The input transducer 51 is coupled by means of lines 59, 60 to an external source of electrical excitation 61. The output transducer 52 is coupled by means of lines 61, 62 to an external load 63. Operationally, having the angular electrode fingers 42 of the input transducer 51 sloped in a direction opposite from that of the angular electrode fingers 43 of the output transducer 52 results in the output transducer 52 receiving the wave launched by the input transducer 51 at the phase shift of 180°, thereby resulting in a net output signal of zero. This result may be expressed mathematically as a sine wave launched by the input transducer 51 in the form of sin $2\pi$ ($ft-kx + [\lambda y/2d]$) with the output transducer 52 receiving the wave in the form of sin $2\pi$ ($ft + \theta + [y/d]$) considering the effect at the output of only a $1/d$ section of the finger. Integrating to achieve the total output and again using the equivalent trigonometric identity for sin $2\pi$ ($x + y$) the resulting integrals of cos $2\pi$ $y/d$ $dy$ and integral sin $2\pi$ ($y/d$) $dy$ at the respective limits of zero and $d$ net out to a zero output along the electrode finger.

Figure 5:
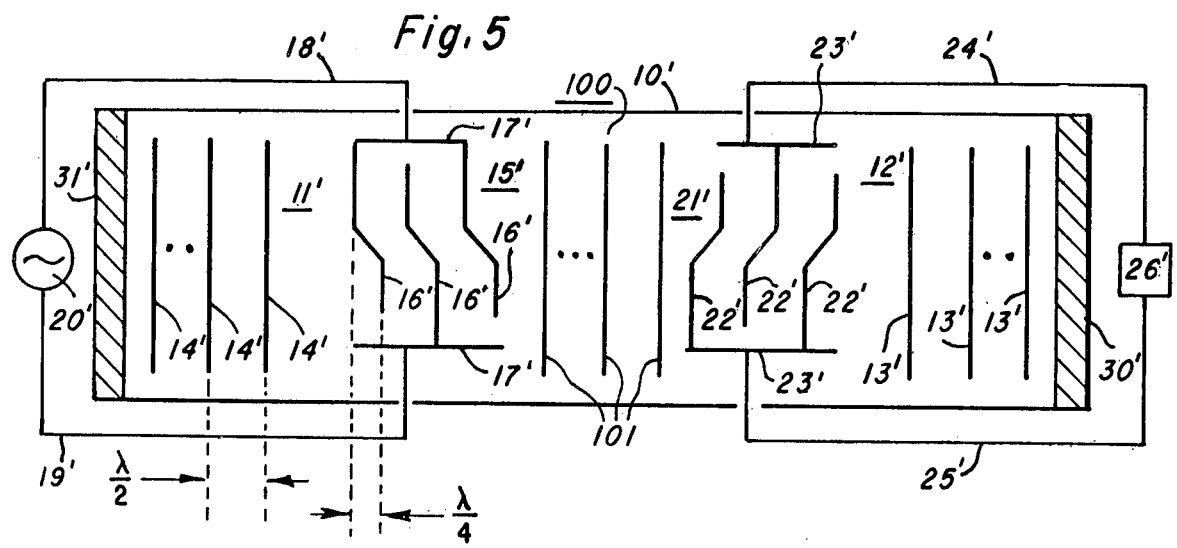
FIG. 5 is a plan view illustrating a multi-pole acoustic surface wave resonator device in accordance with the present invention.

Another embodiment of the resonator device constructed in accordance with the present invention is disclosed in FIG. 5, where additional reflecting means in the form of a reflective grating structure 100 are introduced between the input and output interdigital transducers of the device. This additional reflecting means defines two cavities, one containing the input transducer and the other containing the output transducer. The purpose of this design is to change the resonator frequency response. The type of coupling transducer described in the present invention still serves the purpose of suppressing the undesired direct frequency response between the input transducer and the output transducer. Although for purposes of illustration only one reflective grating structure has been shown between input and output transducers, it will be understood that one or more reflective grating structures may be placed between the coupling transducers. Since the resonator device shown in FIG. 5 is otherwise identical to the embodiment shown in FIG. 1, to avoid repetitious description corresponding structural elements in FIG. 5 have been designated by the same reference numerals employed in connection with the embodiment of FIG. 1 with the prime (') notation added. Acoustic coupling means between the input and output interdigital transducers 15', 21' takes the form of a third intermediate reflective grating structure 100 comprising a plurality of discontinuities 101 of the same character of the discontinuities, 13', 14' located outwardly on the substrate 10' with respect to the input interdigital transducer 15' and the output interdigital transducer 21', respectively. The discontinuities 101 of the intermediate grating structure 100 are preferably formed in the same manner as the discontinuities 13', 14' of the first and second grating structures 11', 12'. The individual reflective discontinuities 101 of the intermediate grating structure 100 comprise an acoustic coupling between input and output interdigital transducers 15', 21', the discontinuities 101 being equally spaced with the distance between centers of adjacent discontinuities being substantially equal to one-half wave length at the resonant frequency of the device. The input interdigital transducer 15' is comprised of electrode fingers extending from conductive transducer pads 17', 23' and having an intermediate offset between the linear portions of the finger a distance of one-quarter wavelength of the resonant frequency. The output transducer 21' is comprised of electrode fingers 22' having its intermediate finger offset at a distance one-quarter wavelength at the resonant frequency in a direction opposite to that of the input interdigital transducer 15'. Again this acoustic surface wave transducer configuration will suppress the direct transmission between the two coupling transducers 15', 21'.

Figure 6:
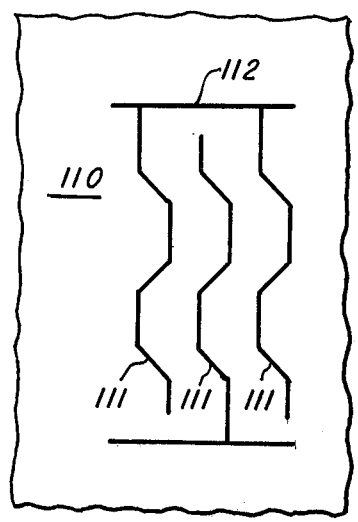
FIG. 6 is a plan view of an acoustic surface wave interdigital transducer which may be alternatively employed as the transducer of the embodiments of FIGS. 1 and 5.
Figure 7:
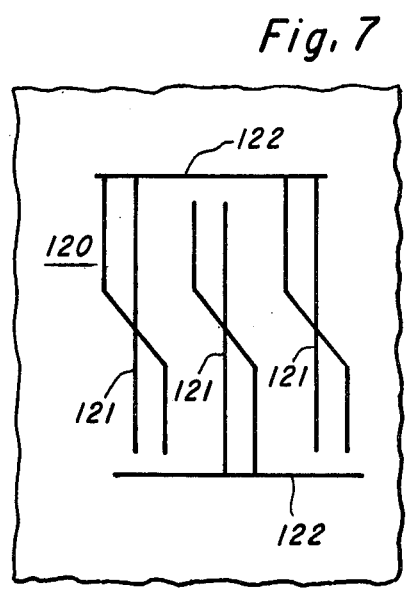
FIG. 7 is a plan view of an acoustic surface wave interdigital transducer of the split electrode type which may be alternatively employed as the transducer of the embodiments of FIGS. 1 and 5.

FIGS. 6 and 7 illustrate alternate forms of interdigital transducers which may be employed in the acoustic surface wave resonator device in accordance with the present invention. FIG. 6 shows an interdigital transducer 110 generally sinuous in nature, comprised of electrode fingers 111 alternately originating from sets of opposed conductive transducer pads 112. The transducer electrode fingers 111 comprise a series of offsets as defined hereinabove of one-quarter wavelength measured at resonant frequency, and separated by linear portions of the electrode finger with the offsets alternating in direction. FIG. 7 shows an interdigital transducer 120 having a split electrode configuration, comprised of electrode finger pairs 121 alternately originating from sets of opposed conductive transducer pads 122. The electrode finger pairs 121 are configured to include one linear finger perpendicularly extending from the transducer pad corresponding thereto, and one finger having an intermediate angular offset portion laterally crossing over the linear finger. Use of the split electrode transducer 120 is effective to substantially reduce or suppress transducer reflections which would otherwise perturb the mode of the resonator device. Thus, the mode of a resonator device including one or more interdigital transducers of the split electrode type illustrated in FIG. 7 is rendered substantially free of perturbation from transducer generated reflections.

Although the resonator devices in accordance with this invention have been described as being provided on substrates of piezoelectric material, it will be understood that such resonator devices may be formed on a film of piezoelectric material which is deposited on a substrate of non-piezoelectric material.

Although the present invention has been described with a certain degree of particularity, it is understood that the present disclosure is made by way of example and not by way of limitation in that numerous changes in the details of construction and the combination of parts may be resorted to without departing from the spirit and scope of the invention.

What is claimed is:

1. An acoustic surface wave resonator device comprising:

substrate means having at least a surface of piezoelectric material on which acoustic surface waves may be propagated, first and second means on said substrate means for reflecting acoustic surface waves propagating thereon, said second reflecting means being disposed a predetermined distance from said first reflecting means so as to define a cavity therebetween for supporting a standing wave at a resonant frequency, input and output interdigital transducer means for electric to acoustic conversion at the input transducer means and acoustic to electric conversion at the output transducer means, said input and output transducer means being disposed on said substrate means in the cavity between said first and second reflecting means, each of said input and output transducer means including respective sets of opposed conductive transducer pads, and a plurality of interdigitated electrode finger means alternately originating from one and the other of the set of conductive transducer pads, and each of said pluralities of interdigitated electrode finger means of said input and output transducer means including at least a portion thereof located at a position centered upon the peak of the standing wave to be established between said first and second reflecting means and an integral intermediate portion located in offset relationship to the peak of the standing wave.

2. A resonator device as set forth in claim 1, wherein said substrate means comprises a substrate made entirely of piezoelectric material.

3. A resonator device as set forth in claim 1, wherein each of said first and second reflecting means comprises a reflecting grating structure formed at the surface of said substrate means.

4. A resonator device as set forth in claim 3, wherein each of said reflecting grating structures comprises a plurality of discontinuities placed one-half wavelength apart.

5. A resonator device as set forth in claim 1, further including a reflective grating structure between said input and output interdigital transducer means.

6. A resonator device as set forth in claim 1, wherein the offset intermediate portions of the electrode finger means of said input interdigital transducer means are arranged in an offset relationship which is opposite in direction along the length of said substrate means with respect to the offset intermediate portions of the electrode finger means of said output interdigital transducer means.

7. An acoustic surface wave resonator device comprising:
  substrate means having at least a surface of piezoelectric material on which acoustic surface waves may be propagated,
  first and second means on said substrate means for reflecting acoustic surface waves propagating thereon, said second reflecting means being disposed a predetermined distance from said first reflecting means so as to define a cavity therebetween for supporting a standing wave at a resonant frequency,
  input and output interdigital transducer means for electric to acoustic conversion at the input transducer means and acoustic to electric conversion at the output transducer means, said input and output transducer means being disposed on said substrate means in the cavity between said first and second reflecting means,
  each of said input and output transducer means including respective sets of opposed conductive transducer pads, and a plurality of interdigitated electrode finger means alternately originating from one and the other of the set of conductive transducer pads, and
  each of said pluralities of interdigitated electrode finger means of said input and output transducer means including intermediate portions thereof located in offset relationship to the peak of the standing wave to be established between said first and second reflecting means, each of said electrode finger means extending from the transducer pad corresponding thereto at a position centered upon the peak of the standing wave, said intermediate portion thereof being offset one-quarter wavelength between the linear portions of the electrode finger means.

8. An acoustic surface wave resonator device comprising:
  substrate means having at least a surface of piezoelectric material on which acoustic surface waves may be propagated,
  first and second means on said substrate means for reflecting acoustic surface waves propagating thereon, said second reflecting means being disposed a predetermined distance from said first reflecting means so as to define a cavity therebetween for supporting a standing wave at a resonant frequency,
  input and output interdigital transducer means for electric to acoustic conversion at the input transducer means and acoustic to electric conversion at the output transducer means, said input and output transducer means being disposed on said substrate means in the cavity between said first and second reflecting means,
  each of said input and output transducer means including respective sets of opposed conductive transducer pads, and a plurality of interdigitated electrode finger means alternately originating from one and the other of the set of conductive transducer pads, and
  each of said pluralities of interdigitated electrode finger means of said input and output transducer means including intermediate portions thereof located in offset relationship to the peak of the standing wave to be established between said first and second reflecting means, each of said electrode finger means extending from the transducer pads corresponding thereto at a position centered upon the peak of the standing wave, said intermediate portion thereof being declensionally offset one-quarter wavelength between the linear portions of the electrode finger means.

9. An acoustic surface wave resonator device comprising:
  substrate means having at least a surface of piezoelectric material on which acoustic surface waves may be propagated,
  first and second means on said substrate means for reflecting acoustic surface waves propagating thereon, said second reflecting means being disposed a predetermined distance from said first reflecting means so as to define a cavity therebetween for supporting a standing wave at a resonant frequency,
  input and output interdigital transducer means for electric to acoustic conversion at the input transducer means and acoustic to electric conversion at the output transducer means, said input and output transducer means being disposed on said substrate means in the cavity between said first and second reflecting means,
  each of said input and output transducer means including respective sets of opposed conductive transducer pads, and a plurality of interdigitated finger means alternately originating from one and the other of the set of conductive transducer pads, and
  each of said plurality of interdigitated electrode finger means of said input and output transducer means including intermediate portions thereof located in offset relationship to the peak of the standing wave to be established between said first and second reflecting means, each of said electrode finger means extending from the transducer pads corresponding thereto at a position centered upon the peak of the standing wave, each electrode finger means including a series of declensional offsets of one-quarter wavelength separated by linear portions of the electrode finger means, and the offsets in each series thereof being in alternating directions.

10. An acoustic surface wave resonator device comprising:
  substrate means having at least a surface of piezoelectric material on which acoustic surface waves may be propagated, first and second means on said substrate means for reflecting acoustic surface waves propagating thereon, said second reflecting means being disposed a predetermined distance from said first reflecting means so as to define a cavity therebetween for supporting a standing wave at a resonant frequency, input and output interdigital transducer means for electric to acoustic conversion at the input transducer means and acoustic to electric conversion at the output transducer means, said input and output transducer means being disposed on said substrate means in the cavity between said first and second reflecting means, each of said input and output transducer means including respective sets of opposed conductive transducer pads, and a plurality of interdigitated electrode finger means alternately originating from one and the other of the set of conductive transducer pads, and each of said pluralities of interdigitated electrode finger means of said input and output transducer means including intermediate portions thereof located in offset relationship to the peak of the standing wave to be established between said first and second reflecting means, each of said electrode finger means comprising pairs of fingers in the split electrode configuration for interdigital transducers such that the finger pairs are centered upon the peak of the standing wave, each of said finger pairs including one linear finger perpendicularly extended from the transducer pad corresponding thereto, and a finger having an intermediate angular offset portion laterally crossing over the linear finger.

11. An acoustic surface wave resonator comprising:

substrate means having at least a surface layer of piezoelectric material on which acoustic surface waves may be propagated, first and second means on said substrate means for reflecting acoustic surface waves propagating thereon, said second reflecting means being disposed a predetermined distance from said first reflecting means so as to define a cavity therebetween for supporting a standing wave at a resonant frequency, input and output interdigital transducer means for electric to acoustic conversion at the input transducer means and acoustic to electric conversion at the output transducer means, said input and output transducer means being disposed on said substrate means in the cavity between said first and second reflecting means, each of said input and output transducer means including respective sets of opposed conductive transducer pads, and a plurality of interdigitated electrode finger means alternately originating from one and the other of the set of conductive transducer pads, and each of said pluralities of interdigitated electrode finger means of said input and output transducer means linearly extending from the transducer pads corresponding thereto at a slope designated by the formula $\lambda/2d$, where $\lambda$ is the wavelength at the resonant frequency and $d$ is the length of the electrode.

12. A resonator device as set forth in claim 11, wherein the electrode finger means of said input interdigital transducer means are arranged opposite in direction to the electrode finger means of said output interdigital transducer means.

13. A resonator device as set forth in claim 11, wherein said electrode finger means comprise pairs of fingers in the split electrode configuration for interdigital transducers such that the finger pairs are centered upon the peak of the standing wave, each of said finger pairs including one linear finger perpendicularly extended from the transducer pad corresponding thereto, and a finger having an intermediate angular offset portion laterally crossing over the linear finger.

14. A resonator device as set forth in claim 11, further including a reflective grating structure between said input and output interdigital transducer means.

* * * * *